(12) United States Patent
Forbes

(10) Patent No.: US 6,972,599 B2
(45) Date of Patent: Dec. 6, 2005

(54) PSEUDO CMOS DYNAMIC LOGIC WITH DELAYED CLOCKS

(75) Inventor: Leonard Forbes, Corvallis, OR (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 10/228,703

(22) Filed: Aug. 27, 2002

(65) Prior Publication Data

US 2004/0041591 A1 Mar. 4, 2004

(51) Int. Cl.[7] .......................... H03K 19/096; G11C 7/12
(52) U.S. Cl. ............................ 326/97; 326/98; 365/203
(58) Field of Search ............................ 326/93, 95–98, 326/203

(56) References Cited

U.S. PATENT DOCUMENTS

| | | | |
|---|---|---|---|
| 4,831,285 A | 5/1989 | Gaiser | 326/39 |
| 5,258,666 A | * 11/1993 | Furuki | 326/106 |
| 5,315,301 A | 5/1994 | Hosotani et al. | 341/94 |
| 5,467,026 A | 11/1995 | Arnold | 326/16 |
| 5,670,898 A | 9/1997 | Fang | 326/93 |
| 5,821,778 A | * 10/1998 | Bosshart | 326/95 |
| 5,825,208 A | * 10/1998 | Levy et al. | 326/98 |
| 5,926,487 A | 7/1999 | Chappell et al. | 714/731 |
| 5,999,019 A | 12/1999 | Zheng et al. | 326/98 |
| 6,208,907 B1 | 3/2001 | Durham et al. | 700/121 |
| 6,265,897 B1 | 7/2001 | Poirier et al. | 326/93 |
| 6,362,645 B2 | 3/2002 | Hayakawa | 326/38 |
| 6,373,290 B1 | 4/2002 | Forbes | 326/98 |
| 6,466,057 B1 | 10/2002 | Naffziger | 326/121 |
| 6,549,038 B1 | 4/2003 | Sechen et al. | 326/93 |
| 6,563,345 B2 | 5/2003 | Forbes | 326/98 |
| 6,597,203 B2 | 7/2003 | Forbes | 326/98 |
| 6,624,686 B1 | 9/2003 | Gedamu et al. | |
| 6,649,476 B2 | * 11/2003 | Forbes | 438/268 |
| 6,664,813 B2 | 12/2003 | McCurdy et al. | 326/121 |
| 2002/0110032 A1 | 8/2002 | Forbes | 365/203 |
| 2002/0130685 A1 | 9/2002 | Forbes | 326/98 |

(Continued)

OTHER PUBLICATIONS

Krause, M A., et al., "Programmable logic array structures for CMOS VLSI", *International Electrical, Electronics Conference Proceedings*, (1983), Abstract.

McMurchie, Larry, et al., "Output Prediction Logic: a High–Performance CMOS Design Technique", *Computer Design*, (2000), pp. 247–254.

Rabaey, JM., "Digital integrated circuits, a design perspective", (1996), pp. 205–209.

Rajsuman, R, et al., "CMOS stuck–open fault detection using single test patterns", *26th ACM/IEEE Design Automation Conference*, (1989), Abstract.

Sakamoto, H., "Grounded Load Complementary FET Circuits: Sceptre Analysis", *IEEE Journal of Solid–State Circuits, vol. SC–8, No. 4*, (Aug. 1973), pp. 282–284.

Subba, N, et al., "Pseudo–nMOS revisited: impact of SOI on low power, high speed circuit design", *IEEE International SOI Conference*, (2000), Abstract.

Sun, Sheng, et al., "A High–Performance 64–bit Adder Implemented in Output Prediction Logic", *Advanced Research in VLSI*, (2001), pp. 213–222.

*Primary Examiner*—James H. Cho
(74) *Attorney, Agent, or Firm*—Schwegman, Lundberg, Woessner & Kluth, P.A.

(57) ABSTRACT

Structures and methods for pseudo-CMOS dynamic logic with delayed clocks are provided. A pseudo-CMOS dynamic logic circuit with delayed clocks includes a dynamic pseudo-nMOS logic gate and a dynamic pseudo-pMOS logic gate coupled thereto. The dynamic pseudo-nMOS logic gate includes a delayed enable clock transistor coupled to a source region of at least two input transistors. The dynamic pseudo-pMOS logic gate includes a delayed enable clock transistor coupled to a drain of at least two input transistors. None of the logic input devices are connected in series.

59 Claims, 5 Drawing Sheets

U.S. PATENT DOCUMENTS

| | | | |
|---|---|---|---|
| 2002/0130686 A1 | 9/2002 | Forbes | 326/98 |
| 2003/0049910 A1 | 3/2003 | Forbes | 438/323 |
| 2003/0076721 A1 | 4/2003 | Forbes | 365/200 |
| 2003/0153156 A1 | 8/2003 | Forbes | 438/300 |
| 2003/0206037 A1 | 11/2003 | Forbes | 326/98 |
| 2003/0227072 A1 | 12/2003 | Forbes | 257/616 |

* cited by examiner

PSEUDO CMOS DYNAMIC LOGIC WITH DELAYED CLOCKS

CROSS REFERENCE TO RELATED APPLICATIONS

This application is related to the following commonly assigned U.S. patent applications: "Clock-Delayed Pseudo-NMOS Domino Logic, U.S. Pat. No. 6,373,290; "Monotonic Dynamic-Static Pseudo-NMOS Logic Circuits," Ser. No. 09/805,909, now U.S. Pat. No. 6,563,345; and "CMOS Gate Array with Vertical Ultrathin Body Transistors Monotonic Dynamic-Static Pseudo-NMOS Logic Circuits," Ser. No. 09/788,109, each of which disclosure is herein incorporated by reference.

FIELD OF THE INVENTION

The present invention relates generally to integrated circuits and CMOS gate arrays. In particular, the invention relates to pseudo-CMOS dynamic logic with delayed clocks.

BACKGROUND OF THE INVENTION

CMOS technology is used not only for digital integrated circuits due to a low power dissipation, a high density of integration and a low cost of fabrication but also for analog integrated circuits. The most important applications that are using microelectronic components, such as telecommunication equipment, industrial control equipment, auto electronics, require more and more specialized integrated circuits. The continuing development in the semiconductors has led to implementation and use of gate arrays and standard cells as the most modern and inexpensive way to produce ASIC's, Application Specific Integrated Circuits. Gate arrays technologies have a special place in the ASIC design. An ASIC is an integrated circuit that can place on a single chip an entire system or a great part of it, performing not only digital, but also analog functions. A CMOS gate array can be simply described as a matrix of pre-manufactured identical cells that only requires the addition of the final metal and contact masks to define a new circuit function. The gate array technology can quickly respond to the customer requirements in a low cost and efficient manner. Gate arrays can be implemented in a variety of circuit and process technologies including most commonly static CMOS and bipolar emitter coupled logic.

One of the problems in static CMOS logic is the series connections of devices required in logic gates. FIGS. 1A and 1B illustrate the standard CMOS static gates. In static CMOS logic circuits each input, shown as A and B respectively, must drive two gates the gate of one nMOS transistor and the gate of a pMOS transistor. This results in a large area for static CMOS circuits and a large number of metal wiring levels must be utilized to allow interconnections. FIG. 1A illustrates a 2-input positive logic NOR gate. In FIG. 1A, input A drives gates 102 and 104, and input B drives gates 106 and 108. FIG. 1B illustrates a 2-input positive logic NAND gate. In FIG. 1B, input A drives gates 112 and 114, and input B drives gates 116 and 118.

Another problem with static CMOS logic circuits is that in the pMOS transistor the hole mobility is about three times lower than the mobility of electrons if the transistors have comparable sizes. Because of this, switching transients are very asymmetrical. The charge up transient of the capacitive load in a simple inverter takes far longer than the discharge transient. To attempt to compensate, the pMOS transistors are often fabricated with a large width or size to provide symmetrical switching. However, this increases the stray capacitive loads and results in an even larger area for the circuits, and very inefficient area utilization.

A number of other approaches to overcome these shortcomings have been developed and are discussed further in the detailed description portion of the present application. However, as detailed therein, each presents or introduces new shortcomings to the circuit design.

For CMOS NOR gates or inverters being clocked at high frequencies where the dynamic switching power is comparable to the DC power of nMOS circuits another type of circuit configuration now commonly referred to as pseudo-nMOS is often employed. (See generally, H. Sakamoto and L. Forbes, "Grounded load complementary FET circuits; SCEPTRE analysis," IEEE J. Solid-State Circuits, Vol. SC-8, No.4, pp. 282–284, 1973; and J. M. Rabaey, "Digital integrated circuits, a design perspective," Prentice Hall, Upper Saddle River, N.J., 1996, pp. 205–209). A pseudo-nMOS circuit configuration is shown in FIG. 2A. The pseudo-nMOS circuit configuration of FIG. 2A is often employed in CMOS inverters and NOR gates. (See generally, M. A. Krause et al., "Programmable logic array structures for CMOS VLSI 1983 International Electrical, Electronics Conference Proceedings, 2628 September 1983, Toronto, Ont., Canada, 26–28 Sept 1983, vol. 2, pp. 304–7; and N. Subba et al., "pseudo-nMOS revisited: impact of SOI on low power, high speed circuit design," IEEE Int. SOI Conference, Wakefield, Mass., Oct 2000, pp. 26–27). However, not all logic functions can be effectively realized with just inverters and NOR gates, it is often desirable to also have NAND gates.

The mirrored configuration of FIG. 2A is referred to as the pseudo-pMOS circuit and is shown in FIG. 2B. (See generally, R. Rajsuman et al., "CMOS stuck-open fault detection using single test patterns," 26th ACM/IEEE Design Automation Conference." 25–29 June 1989, Las Vegas, Nev., pp. 714–17, 1989; and U.S. Pat. No. 5,315,301 "Binary data generating circuit and A/D converter having immunity to noise," 24 May 1994). The pseudo-pMOS illustrated in FIG. 2B is a 2-input positive logic NAND gate and provides a positive logic NAND circuit function. Pseudo-CMOS static logic is then a combination of pseudo-nMOS (FIG. 2A) and pseudo-pMOS gates (FIG. 2B). However, pseudo-CMOS static logic is slow due to the slow pull up of the pMOS devices in NAND gates which must charge the output high if any of the NAND gate inputs, e.g. C or D, is low.

Therefore, there is a need in the art to provide CMOS gate arrays which result in faster switching speeds, use less power, use far fewer devices to conserve chip surface space, and which require much less wiring and circuit complexity that conventional logic array approaches.

SUMMARY OF THE INVENTION

The above mentioned problems with CMOS gate arrays and other problems are addressed by the present invention and will be understood by reading and studying the following specification. Systems and methods are provided for pseudo-CMOS dynamic logic with delayed clocks.

In one embodiment of the present invention, a pseudo-CMOS dynamic logic circuit with delayed clocks is provided. The pseudo-CMOS dynamic logic circuit includes a dynamic pseudo-nMOS logic gate and a dynamic pseudo-pMOS logic gate coupled thereto. In one embodiment, the dynamic pseudo-nMOS logic gate includes a NOR logic gate and the dynamic pseudo-pMOS logic gate includes a NAND logic gate. The dynamic pseudo-nMOS logic gate includes a delayed enable clock transistor coupled to a source region of at least two input transistors. The dynamic pseudo-pMOS logic gate includes a delayed enable clock transistor coupled to a drain of at least two input transistors. None of the logic input devices are connected in series and the pMOS devices are used only for precharge.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

As will be described in more detail below, the present invention describes dynamic pseudo-CMOS with delayed clocks. Dynamic pseudo-CMOS with delayed clocks avoids the slower circuit response of static pseudo-CMOS by precharging all the outputs high.

A delayed enable clock is used to evaluate the logic inputs at each stage or level of the logic in succession. In this latter respect dynamic pseudo-CMOS with delayed clocks is similar to output prediction logic. (See generally, McMurchie, L.; Kio, S.; Yee, G.; Thorp, T.; Sechen, C., "Output prediction logic: a high-performance CMOS design technique," Proc. International Conference on Computer Design, pp. 247–254, 2000). Output prediction logic, OPL, is one of the fastest possible CMOS logic families with switching speeds exceeding static CMOS and domino logic. (See generally, Sheng Sun; McMurchie, L.; Sechen, C., "A high-performance 64-bit adder implemented in output prediction logic," Proc. Advanced Research in VLSI, pp. 213–222, 2001).

Additionally, not only will dynamic pseudo-CMOS with delayed clocks be a high speed logic family but will be even faster than OPL since no series connected devices are used in NAND gates. Dynamic pseudo-CMOS with delayed clocks performs all logic functions with only parallel connected devices and only nMOS transistors are used during the switching transients, both of these contribute to the fastest possible switching speed as well as the dynamic nature of the circuit.

Figure 1A:
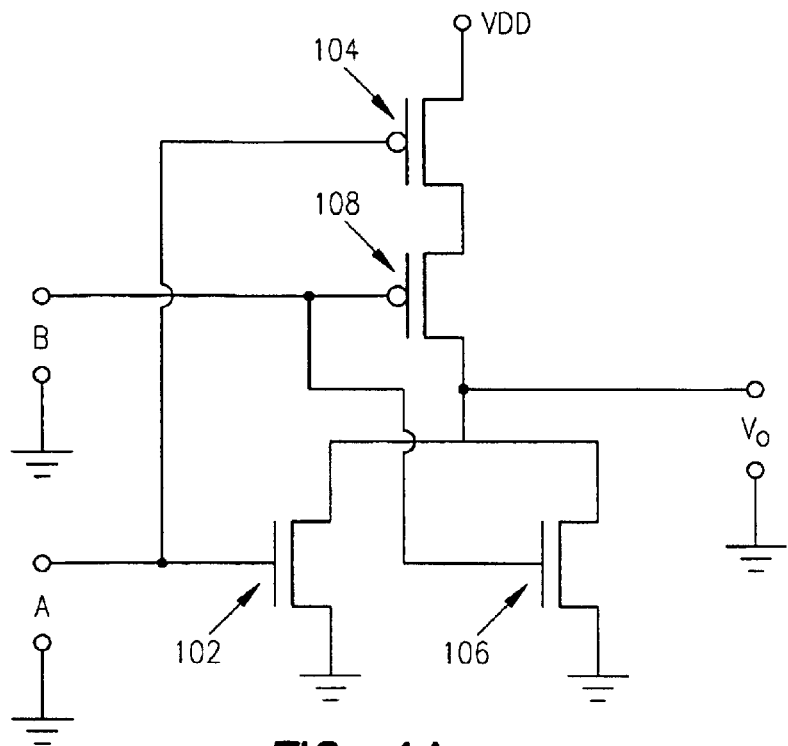
FIG. 1A illustrates a 2-input positive logic NOR gate.
Figure 1B:
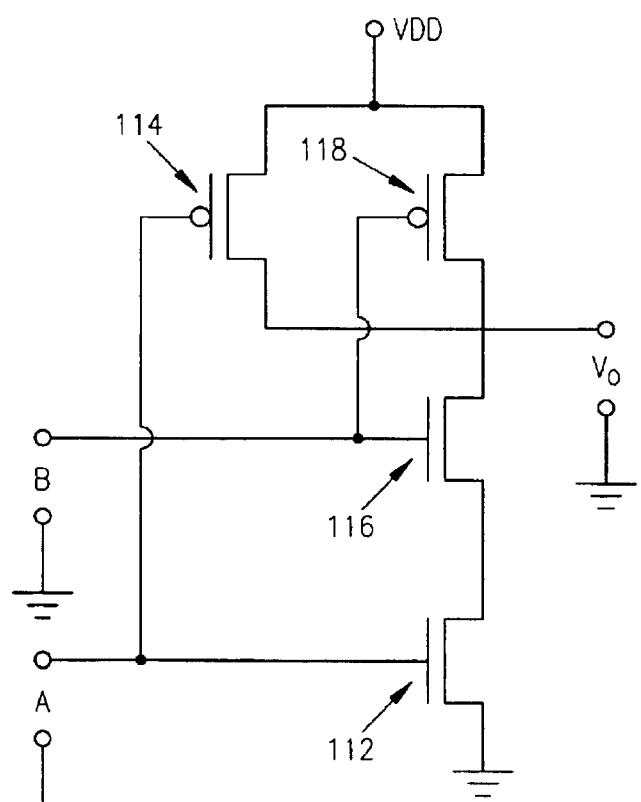
FIG. 1B illustrates a 2-input positive logic NAND gate.
Figure 2A:
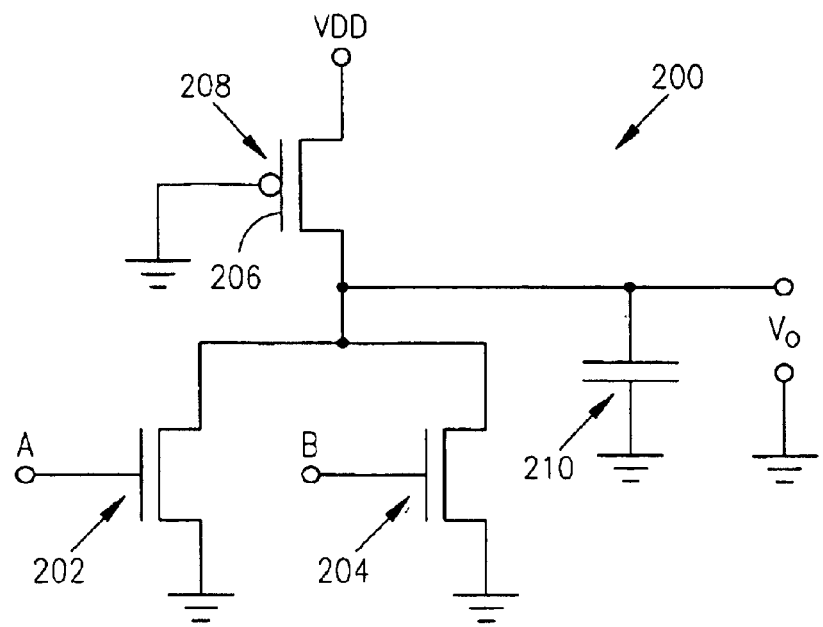
FIG. 2A illustrates a pseudo-nMOS circuit configuration.

FIG. 2A illustrates a pseudo-nMOS circuit 200 configuration (viz. CMOS with the gate 206 of the pMOS pull up device 208 grounded) of a 2-input positive logic NOR gate. If the circuit is designed correctly, or the correct device W/L ratios used, and the circuit ratioed correctly then if one of the nMOS devices, 202 and 204, is on the output (Vo) will be low. This circuit works like a ratioed nMOS static logic circuit. During the switching transient and during the pull up of the output the pMOS device 208 acts like a constant current source charging the load capacitance 210 over a large portion of the switching transient. In this respect the circuit 200 acts like nMOS enhancement and depletion logic circuits. A depletion mode nMOS load device also provides a constant current charging the load capacitance during the pull up of the output voltage (Vo).

Figure 2B:
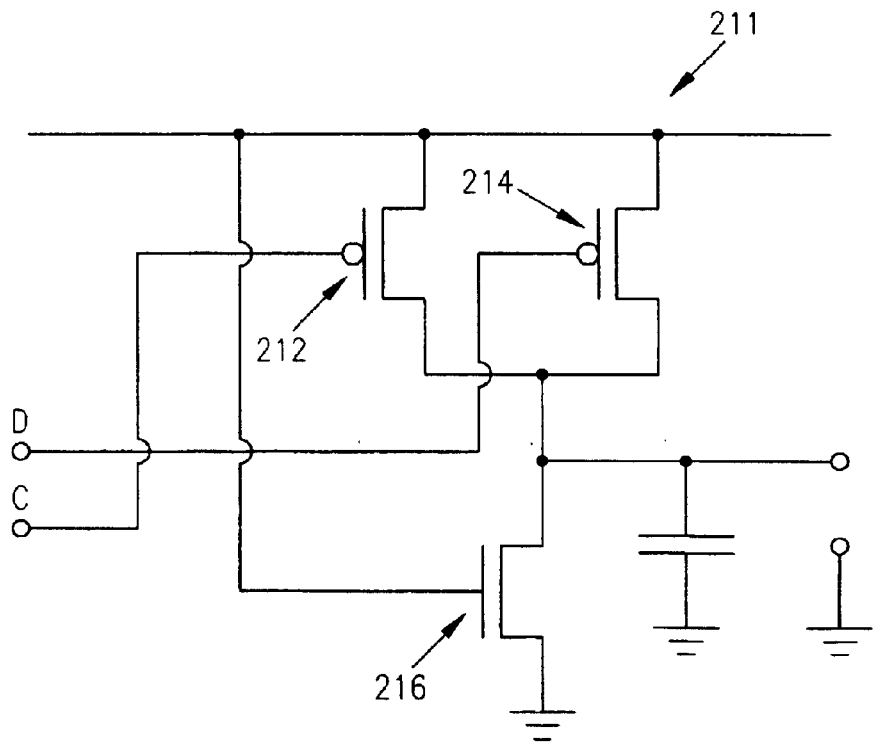
FIG. 2B illustrates a pseudo-pMOS circuit which is the mirrored configuration of FIG. 2A.

FIG. 2B illustrates the mirror imaged configuration or a static logic psuedo-pMOS 2-input NAND 211. The output voltage (Vo) will be high if one of the inputs C and D are low. The output will be low if and only if both inputs C and D are high turning off the pMOS load devices, transistors 212 and 214, which keep the output high. If both transistors 212 and 214 are off then the nMOS device 216 will pull the output low, this again is a ratioed static logic circuit.

The combination of pseudo-nMOS NOR gates and pseudo-pMOS NAND gates can be employed to make up, what we shall call here "static pseudo-CMOS logic circuits." Note that neither of the gates will have series connected logic input devices which increase the resistance of static CMOS switching circuits and slow circuit response. However, the NAND gate here still uses pMOS devices for pull up during the switching transient and the lower hole mobility results in slower and asymmetrical switching transients.

What is required then, and taught by the present application, is a circuit in which pMOS devices are not used during switching transients. This can be accomplished by using dynamic circuit concepts in which the outputs are all precharged high. pMOS devices are used only for precharge.

If the output switches low it does so as the result of a discharge through a higher current and performance nMOS device.

Figure 3A:
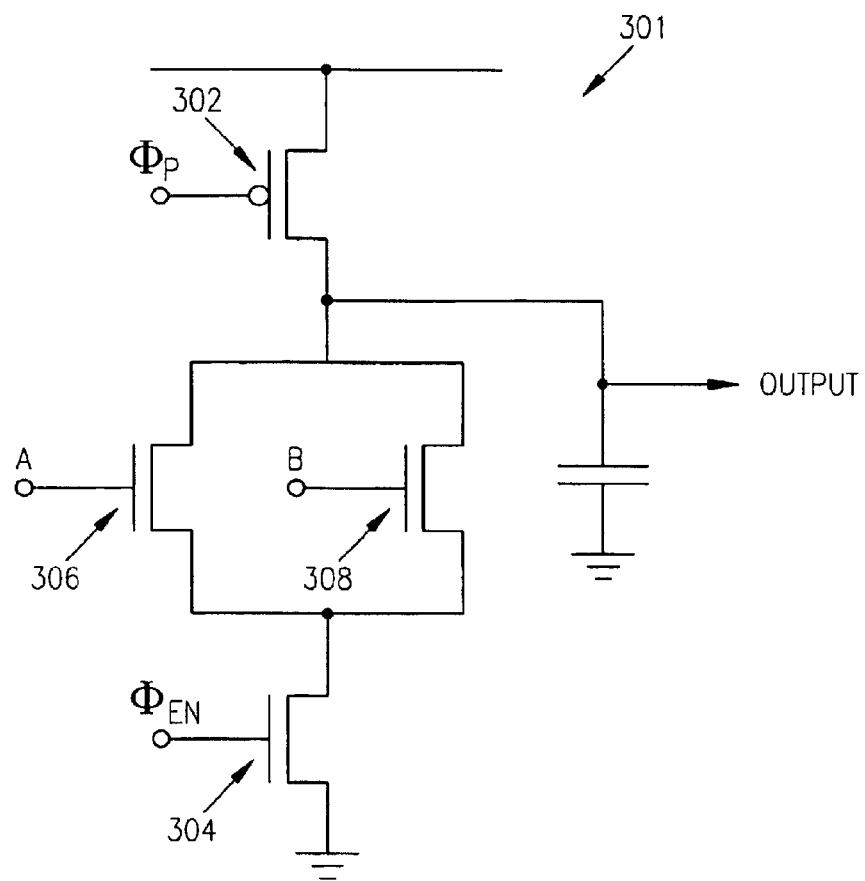
FIG. 3A illustrates a dynamic pseudo-nMOS 2-input NOR gate according to an embodiment of the present invention.

FIG. 3A illustrates a dynamic pseudo-nMOS 2-input NOR gate 301. In one embodiment of the invention, as shown in FIG. 3A, a dynamic pseudo-nMOS NOR gate includes at least two input transistors 306 and 308. According to the teachings of the present invention, the at least two input transistors are n-channel transistors coupled in parallel. A drain region for the at least two input transistors 306 and 308 are coupled to an output and to a drain region of a p-channel pre-charge transistor 302 having a gate coupled to a pre-charge clock, φp. A source region for the at least two input transistors 306 and 308 is coupled to a ground through an n-channel enable transistor having a gate coupled to an enable clock, φen. The pMOS transistor 302 at the top, driven with the precharge clock, φp, is used to precharge the output high. When the enable clock, φen, goes high, driving nMOS transistor 304, then the output load capacitance will discharge if input A or B is high, turning on nMOS transistors 306 and 308. This then is the positive logic NOR circuit function.

Figure 3B:
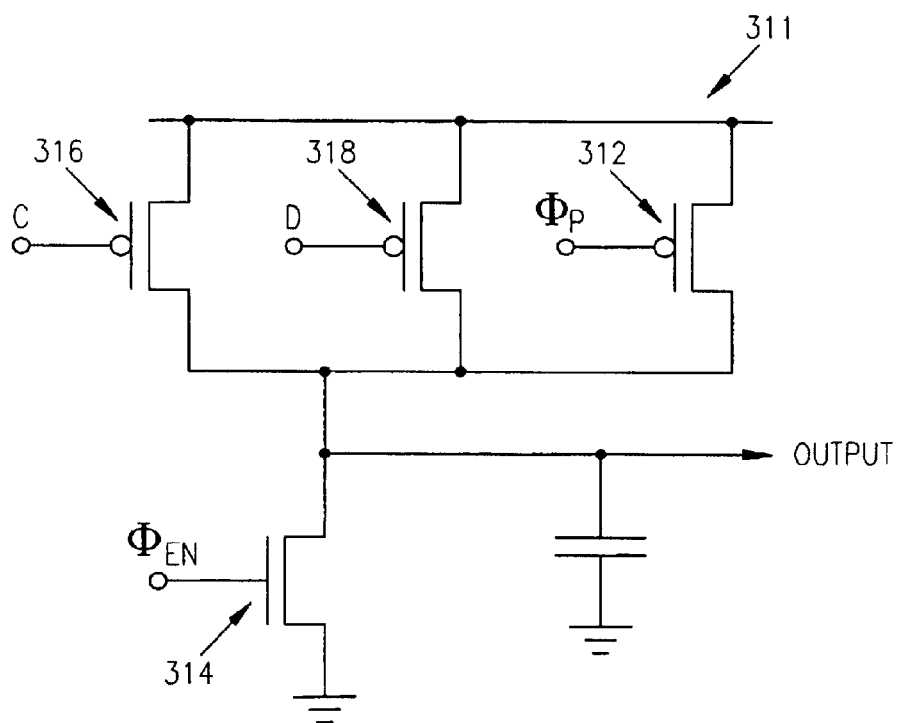
FIG. 3B illustrates a dynamic pseudo-pMOS 2-input NAND gate according to an embodiment of the present invention.

FIG. 3B illustrates a dynamic pseudo-pMOS 2-input NAND gate 311. In one embodiment of the invention, as shown in FIG. 3B, a dynamic pseudo-pMOS NAND gate includes at least two input transistors 316 and 318. According to the teachings of the present invention, the at least two input transistors 316 and 318 are p-channel transistors coupled in parallel. A drain region for the at least two input transistors 316 and 318 are coupled to a ground through an n-channel enable transistor 314 having a gate coupled to an enable clock, φen. The drain region for the at least two input transistors 316 and 318 are coupled to an output. And, according to the teachings of the present invention, the at least two input transistors are coupled in parallel with a p-channel pre-charge transistor 312 having a gate coupled to a pre-charge clock, φp.

The pMOS transistor 312 at the top, driven with the precharge clock, φp, is used to precharge the output high. When the enable clock, φen, driving nMOS transistor 314, goes high then the output load capacitance can discharge if and only if inputs C and D are high, turning off pMOS transistors 316 and 318. Unless both inputs C and D are high, one of the transistors, 316 or 318, will conduct holding the output high. This then is the positive logic NAND circuit function. The output goes low if and only if both inputs C and D are high.

A combination of dynamic pseudo-nMOS NOR gates (FIG. 3A) and dynamic pseudo-pMOS NAND gates (FIG. 3B) can be used for dynamic pseudo-CMOS logic circuits according to the teachings of the present invention.

Figure 4A:
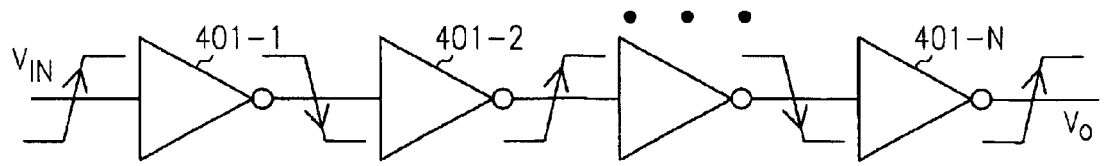
FIG. 4A illustrates the switching of static CMOS gates, in this case a series of inverters.

FIG. 4A illustrates the switching of static CMOS gates, in this case a series of inverters 401-1, 401-2, ..., 401-N. If the input (Vin) switches high the outputs on all stages make a transition of a voltage swing equal to the power supply voltage. Each of these transitions occur sequentially, one being essentially complete before the other begins. This requires a long switching time before valid data appears at the end of the series of inverters 401-1, 401-2, ..., 401-N.

Figure 4B:
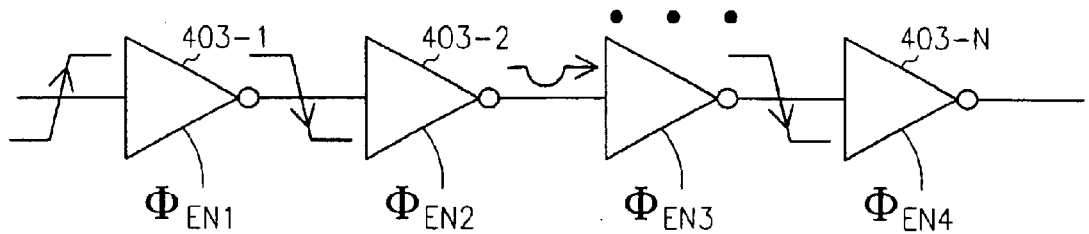
FIG. 4B illustrates the switching of a series of inverters in an output prediction logic circuit (OPL).

FIG. 4B illustrates the switching of a series of inverters 403-1, 403-2, ..., 403-N in an output prediction logic circuit (OPL). In output prediction logic all the outputs are precharged high and delayed clocks are used to enable each stage in succession, shown in FIG. 4B as φen1, φen2, φen3 and φen4. FIG. 4D is a graph which plots applied potential vs. time and illustrates the delayed clocks φp, φen, φen2, φen3, and φen4.

It is noted in FIG. 4B that only one half the outputs need to change state. As a result OPL can be clocked with the enable clocks shown in FIG. 4D with only a small time separation and OPL is two to four time faster that static CMOS logic.

OPL is a static logic family so a simple inverter requires four transistors. Also there will be series connections of NMOS devices in NAIND gates. The combination of a large number of transistors and series connections reduces switching speed.

Figure 4C:
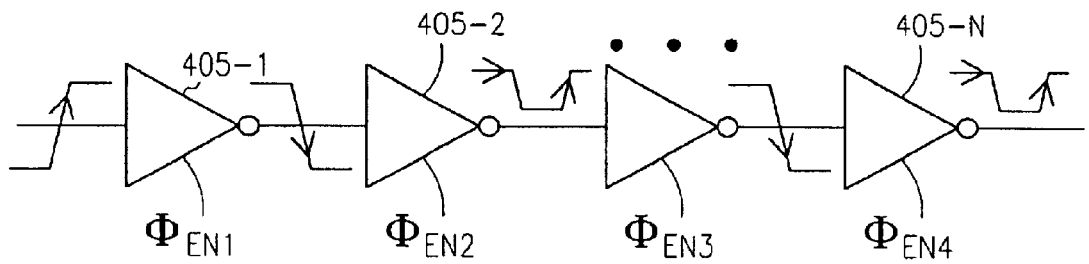
FIG. 4C illustrates a series of pseudo-CMOS dynamic logic gates with the delayed enable clocks shown in FIG. 4D according to the teachings of the present invention.
Figure 4D:
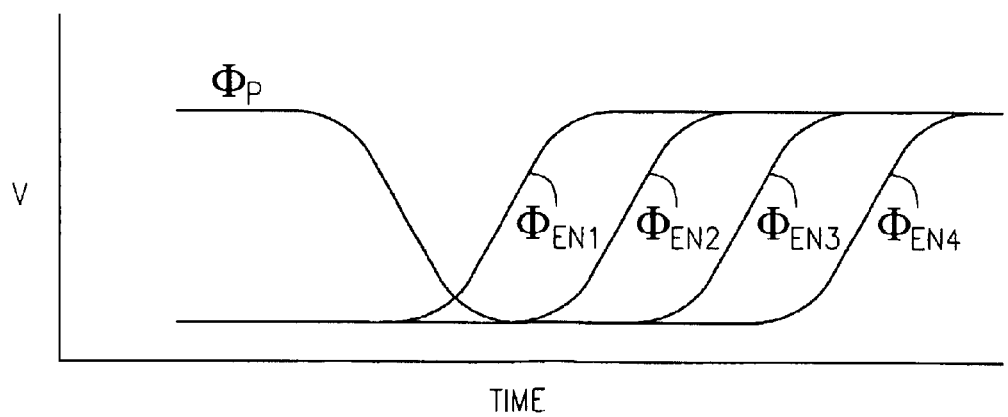
FIG. 4D is a graph which plots applied potential vs. time and illustrates delayed clocks inputs φp, φen, φen2, φen3, and φen4.

FIG. 4C illustrates a series of pseudo-CMOS dynamic logic gates 405-1, 405-2, ..., 405-N with the delayed enable clocks shown in FIG. 4D according to the teachings of the present invention. The delayed enable clocks in 4C are the same delayed clocks used in OPL and shown in FIG. 4B. Like OPL, in the chain of inverters 405-1, 405-2, ..., 405-N shown in FIG. 4C only one half of the outputs will be required to make a transition over the full power supply voltage.

According to the teachings of the present invention Pseudo-CMOS dynamic logic gates with delayed clocks will be faster than OPL due to the smaller number of transistors in a gate, the absence of any series devices in NAND gates, and the dynamic nature of the circuits.

Figure 5:
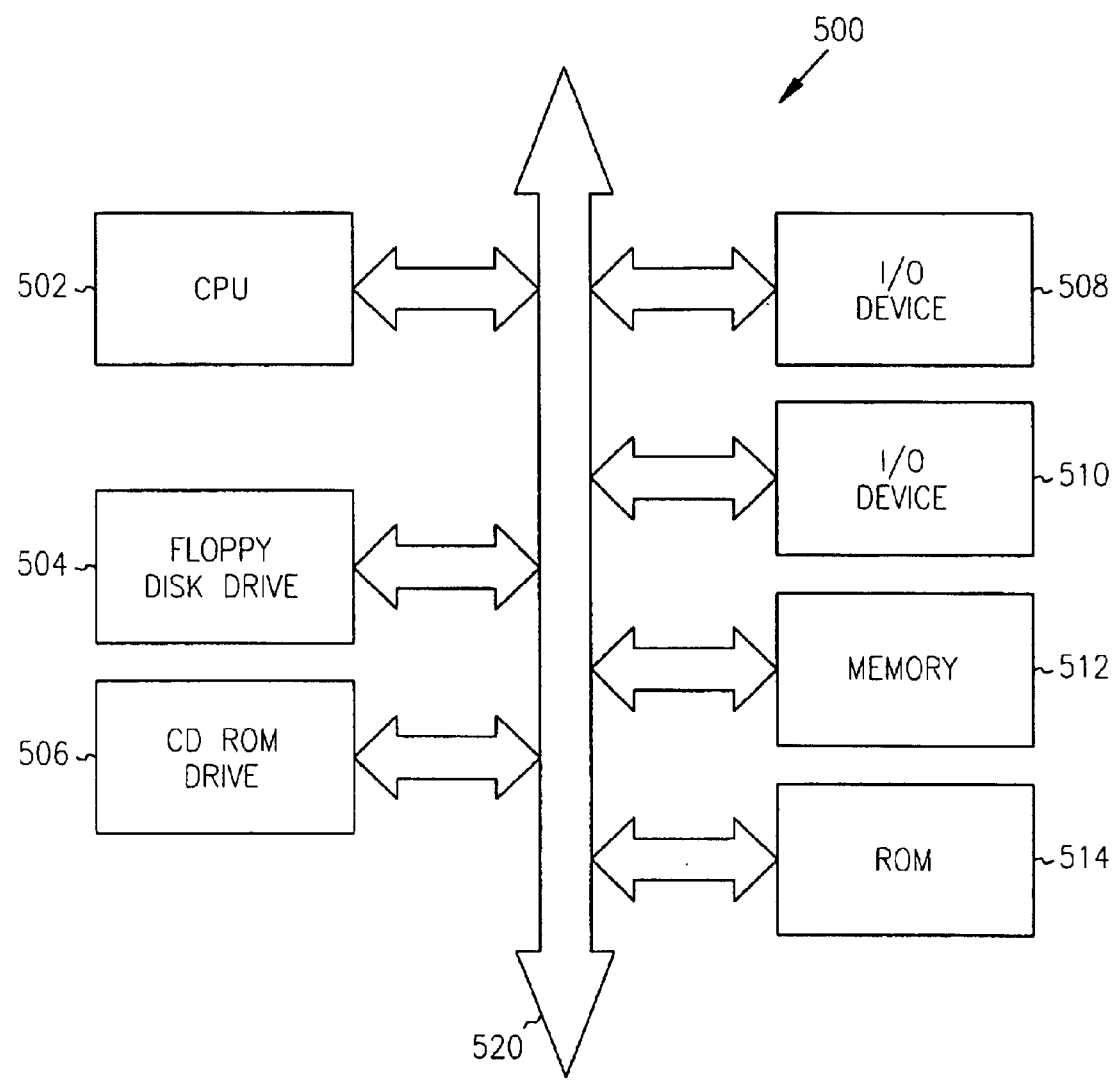
FIG. 5 is a block diagram of an electrical system, or processor-based system, utilizing pseudo-CMOS dynamic logic gates with delayed clocks, according to embodiments of the present invention.

FIG. 5 is a block diagram of an electrical system, or processor-based system, 500. The processor-based system 500 may be a computer system, a process control system or any other system employing a processor and associated memory. The system 500 includes a central processing unit (CPU) 502, e.g., a microprocessor, that communicates with the memory 512 and an I/O device 508 over a bus 520. According to the teachings of the present invention the processor includes a series of pseudo-CMOS dynamic logic gates with delayed clocks. It must be noted that the bus 520 may be a series of buses and bridges commonly used in a processor-based system, but for convenience purposes only, the bus 520 has been illustrated as a single bus. A second I/O device 510 is illustrated, but is not necessary to practice the invention. The processor-based system 500 can also includes read-only memory (ROM) 514 and may include peripheral devices such as a floppy disk drive 504 and a compact disk (CD) ROM drive 506 that also communicates with the CPU 502 over the bus 520 as is well known in the art.

It will be appreciated by those skilled in the art that additional circuitry and control signals can be provided, and that the processor-based system 500 has been simplified to help focus on the invention.

It will be understood that the embodiment shown in FIG. 5 illustrates an embodiment for electronic system circuitry in which a series of pseudo-CMOS dynamic logic gates with delayed clocks are used. The illustration of system 500, as shown in FIG. 5, is intended to provide a general understanding of one application for the structure and circuitry of the present invention, and is not intended to serve as a complete description of all the elements and features of an electronic system using the series of pseudo-CMOS dynamic logic gates with delayed clocks. Further, the invention is equally applicable to any size and type of system 500 using the series of pseudo-CMOS dynamic logic gates with delayed clocks, and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel logic gates described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Methods of Formation and Operation

A method of forming a logic circuit with delayed clocks includes forming a dynamic pseudo-nMOS logic gate and forming a dynamic pseudo-pMOS logic gate coupled thereto. In one embodiment, forming the dynamic pseudo-nMOS logic gate includes forming a dynamic pseudo-nMOS NOR gate and forming the dynamic pseudo-pMOS logic gate includes forming a dynamic pseudo-pMOS NAND gate.

According to the teachings of the present invention, forming the dynamic pseudo-nMOS logic gate includes forming at least two input transistors and coupling a delayed enable clock transistor to a source region of the at least two input transistors. According to the teachings of the present invention, forming the at least two input transistors includes forming n-channel transistors coupled in parallel, where a drain region for the at least two input transistors are coupled to an output. The method further includes forming a p-channel pre-charge transistor having a gate coupled to a pre-charge clock and coupling a drain region for the at least two input transistors to a drain region of the p-channel pre-charge transistor.

According to the teachings of the present invention, forming the dynamic pseudo-pMOS logic gate includes forming at least two input transistors and coupling a delayed enable clock transistor to a drain of at least two input transistors. According to the teachings of the present invention, forming the at least two input transistors includes forming p-channel transistors coupled in parallel. The method includes forming an n-channel enable transistor having a gate coupled to an enable clock. A drain region for the at least two input transistors are coupled to a ground through the n-channel enable transistor. The method further includes forming a p-channel pre-charge transistor having a gate coupled to a pre-charge clock and coupling the p-channel pre-charge transistor in parallel with the at least two input transistors. The method further includes coupling the drain region for the at least two input transistors to an output.

A method for operating a logic circuit includes providing an input signal to a series of pseudo-CMOS dynamic logic gates with delayed clocks. The series has an input and an output. The series is repeating and each pseudo-CMOS dynamic logic gates includes a dynamic pseudo-nMOS NOR gate having an input and an output and a dynamic pseudo-pMOS NAND gate having an input and an output. The dynamic pseudo-pMOS NAND gate is coupled to the dynamic pseudo-nMOS NOR gate. In operation, the method includes pre-charging all of the outputs high and utilizing p-channel devices for pre-charge only.

CONCLUSION

The above structures and fabrication methods have been described, by way of example and not by way of limitation, with respect to pseudo-CMOS dynamic logic gates with delayed clocks.

Pseudo-CMOS dynamic logic gates with delayed clocks is a new CMOS logic family with potential for extremely fast switching speeds. Unlike static CMOS it has no series connections of logic devices, it requires fewer transistors than either static CMOS or OPL. And, like OPL, only about one half the outputs of the logic gates are required to make a transition of the full power supply voltage during the evaluation of any input to the chain. Like all dynamic circuit families the present invention has the potential for high switching speed and low power consumption.

What is claimed is:

1. A pseudo-CMOS dynamic logic circuit with delayed clocks, comprising:
   a dynamic pseudo-nMOS logic gate; and
   a dynamic pseudo-pMOS logic gate coupled thereto,
   wherein each of the dynamic pseudo-nMOS logic gate and the dynamic pseudo-pMOS logic gate has at least two logic inputs, a logic output, an enable clock input, a pre-charge clock input, an n-channel enable transistor having a sate connected to the enable clock input and a pull-up p-channel pre-charge transistor having a drain connected to the logic output and a gate connected to the pre-charge clock input,
   wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

2. The pseudo-CMOS dynamic logic circuit of claim 1, wherein the dynamic pseudo-nMOS logic gate includes a NOR logic gate.

3. The pseudo-CMOS dynamic logic circuit of claim 1, wherein the dynamic pseudo-pMOS logic gate includes a NAND logic gate.

4. The pseudo-CMOS dynamic logic circuit of claim 1, wherein the n-channel enable transistor for the dynamic pseudo-nMOS logic gate includes a delayed enable clock transistor coupled to a source region of at least two input transistors.

5. The pseudo-CMOS dynamic logic circuit of claim 4, wherein the at least two input transistors are n-channel transistors coupled in parallel, wherein a drain region for the at least two input transistors are coupled to the logic output and to a drain region of the p-channel pre-charge transistor.

6. The pseudo-CMOS dynamic logic circuit of claim 1, wherein the n-channel enable transistor for the dynamic pseudo-pMOS logic gate includes a delayed enable clock transistor coupled to a drain of at least two input transistors.

7. The pseudo-CMOS dynamic logic circuit of claim 6, wherein the at least input transistors are p-channel transistors coupled in parallel, wherein a drain region for the at least two input transistors are coupled to a ground through the n-channel enable transistor, and wherein the at least two input transistors are coupled in parallel with the p-channel pre-charge transistor.

8. A pseudo-CMOS dynamic logic circuit with delayed clocks, comprising:
   a dynamic pseudo-nMOS NOR gate; and
   a dynamic pseudo-pMOS NAND gate coupled thereto,
   wherein each of the dynamic pseudo-nMOS NOR gate and the dynamic pseudo-pMOS NAND gate has at least two logic inputs, a logic output, an enable clock input, a pre-charge clock input, an n-channel enable transistor having a gate connected to the enable clock input and a pull-up p-channel pre-charge transistor having a drain connected to the logic output and a gate connected to the pre-charge clock input, wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

9. The pseudo-CMOS dynamic logic circuit of claim 8, wherein the dynamic pseudo-nMOS NOR gate includes at least two input transistors, wherein the at least two input transistors are n-channel transistors coupled in parallel, wherein a drain region for the at least two input transistors are coupled to the logic output and to a drain region of the p-channel pre-charge transistor, and wherein a source region for the at least two input transistors is coupled to a ground through the n-channel enable transistor.

10. The pseudo-CMOS dynamic logic circuit of claim 8, wherein the dynamic pseudo-pMOS NAND gate includes at least two input transistors, wherein the input transistors are p-channel transistors coupled in parallel, wherein a drain region for the at least two input transistors are coupled to a ground through the n-channel enable transistor, and wherein the at least two input transistors are coupled in parallel with the p-channel pre-charge transistor.

11. The pseudo-CMOS dynamic logic circuit of claim 10, wherein the drain region for the at least two input transistors are coupled to the logic output.

12. A pseudo-CMOS dynamic logic circuit with delayed clocks, comprising:
   a dynamic pseudo-nMOS NOR gate, wherein the dynamic pseudo-nMOS NOR gate includes at least two input transistors, wherein the at least two input transistors are n-channel transistors coupled in parallel, wherein a drain region for the at least two input transistors are coupled to an output and to a drain region of a p-channel pre-charge transistor having a gate coupled to a pre-charge clock, and wherein a source region for the at least two input transistors is coupled to a ground through an n-channel enable transistor having a gate coupled to an enable clock; and
   a dynamic pseudo-pMOS NAND gate coupled thereto, wherein the dynamic pseudo-pMOS NAND gate includes at least two input transistors, wherein the at least two input transistors are p-channel transistors coupled in parallel, wherein a drain region for the at least two input transistors are coupled to a ground through an n-channel enable transistor having a gate coupled to an enable clock, wherein the drain region for the at least two input transistors are coupled to an output, and wherein the at least two input transistors are coupled in parallel with a p-channel pre-charge transistor having a gate coupled to a pre-charge clock.

13. The pseudo-CMOS dynamic logic circuit of claim 12, wherein in operation the outputs are all pre-charged high.

14. The pseudo-CMOS dynamic logic circuit of claim 12, wherein in operation the p-channel transistors are used only for pre-charge.

15. A logic circuit, comprising:
   a series of pseudo-CMOS dynamic logic gates with delayed clocks, the series having an input and an output, wherein the series is repeating and each pseudo-CMOS dynamic logic gates includes:
   a dynamic pseudo-nMOS NOR gate; and
   a dynamic pseudo-pMOS NAND gate coupled thereto, wherein each of the dynamic pseudo-nMOS NOR gate and the dynamic pseudo-pMOS NAND sate has at least two logic inputs, a logic output, an enable clock input, a pre-charge clock input, an n-channel enable transistor to be controlled by an enable clock signal on the enable clock input and a pull-up p-channel pre-charge transistor having a drain connected to the logic output and a gate connected to the pre-charge clock input,
   wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

16. The logic circuit of claim 15, wherein the dynamic pseudo-nMOS NOR gate includes at least two input transistors, wherein the at least two input transistors are n-channel transistors coupled in parallel, wherein a drain region for the at least two input transistors are coupled to the logic output and to a drain region of the p-channel pre-charge transistor, and wherein a source region for the at least two input transistors is coupled to a ground through the n-channel enable transistor.

17. The logic circuit of claim 15, wherein the dynamic pseudo-pMOS NAND gate includes at least two input transistors, wherein the at least two input transistors are p-channel transistors coupled in parallel, wherein a drain region for the at least two input transistors are coupled to a ground through the n-channel enable transistor, and wherein the at least two input transistors are coupled in parallel with the p-channel pre-charge transistor.

18. The logic circuit of claim 17, wherein the drain region for the at least two input transistors are coupled to the logic output.

19. A logic circuit with delayed clocks, comprising:
   a dynamic pseudo-nMOS NOR gate, wherein the dynamic pseudo-nMOS NOR gate includes at least two input transistors, wherein the at least two input transistors are n-channel transistors coupled in parallel, wherein a drain region for the at least two input transistors are coupled to an output and to a drain region of a p-channel pre-charge transistor having a gate coupled to a pre-charge clock, and wherein a source region for the at least two input transistors is coupled to a ground through an n-channel enable transistor having a gate coupled to an enable clock; and
   a dynamic pseudo-pMOS NAND gate coupled thereto, wherein the dynamic pseudo-pMOS NAND gate includes at least two input transistors, wherein the at least two input transistors are p-channel transistors coupled in parallel, wherein a drain region for the at least two input transistors is coupled to a ground through an n-channel enable transistor having a gate coupled to an enable clock, wherein the drain region for the at least two input transistors are coupled to an output, and wherein the at least two input transistors are coupled in parallel with a p-channel pre-charge transistor having a gate coupled to a pre-charge clock.

20. The logic circuit of claim 19, wherein in operation the outputs are all pre-charged high.

21. The logic circuit of claim 19, wherein in operation the p-channel transistors are used only for pre-charge.

22. An electronic system, comprising:
a logic circuit; and
a memory coupled thereto by a bus; and
wherein the logic circuit includes a pseudo-CMOS dynamic logic circuit with delayed clocks, comprising:
a dynamic pseudo-nMOS logic gate; and
a dynamic pseudo-pMOS logic gate coupled thereto,
wherein each of the dynamic pseudo-nMOS logic gate and the dynamic pseudo-pMOS logic gate has at least two logic inputs, a logic output, an enable clock input, a pre-charge clock input, an n-channel enable transistor having a gate connected to the enable clock input and a pull-up p-channel pre-charge transistor having a drain connected to the logic output and a gate connected to the pre-charge clock input,
wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

23. The electronic system of claim 22, wherein the dynamic pseudo-nMOS logic gate includes a NOR logic gate.

24. The electronic system of claim 22, wherein the dynamic pseudo-pMOS logic gate includes a NAND logic gate.

25. The electronic system of claim 22, wherein the n-channel enable transistor for the dynamic pseudo-nMOS logic gate includes a delayed enable clock transistor coupled to a source region of at least two input transistors.

26. The electronic system of claim 25, wherein the at least two input transistors are n-channel transistors coupled in parallel, wherein a drain region for the at least two input transistors are coupled to the logic output and to a drain region of a p-channel pre-charge transistor.

27. The electronic system of claim 22, wherein the n-channel enable transistor for the dynamic pseudo-pMOS logic gate includes a delayed enable clock transistor coupled to a drain of at least two input transistors.

28. The electronic system of claim 27, wherein the at least two input transistors are p-channel transistors coupled in parallel, wherein a drain region for the at least two input transistors are coupled to a ground through the n-channel enable transistor, and wherein the at least two input transistors are coupled in parallel with the p-channel pre-charge transistor.

29. An electronic system, comprising:
a processor, wherein the processor includes a series of pseudo-CMOS dynamic logic gates with delayed clocks, the series having an input and an output, wherein the series is repeating and each pseudo-CMOS dynamic logic gate includes:
a dynamic pseudo-nMOS NOR gate; and
a dynamic pseudo-pMOS NAND gate coupled thereto; and
a memory coupled to the processor via a bus,
wherein each of the dynamic pseudo-nMOS NOR gate and the dynamic pseudo-pMOS NAND gate has at least two logic inputs, a logic output, an enable clock input, a pre-charge clock input, an n-channel enable transistor having a gate connected to the enable clock input and a pull-up p-channel pre-charge transistor having a drain connected to the logic output and a gate connected to the pre-charge clock input,
wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

30. The electronic system of claim 29, wherein the dynamic pseudo-nMOS NOR gate includes at least two input transistors, wherein the at least two input transistors are n-channel transistors coupled in parallel, wherein a drain region for the at least two input transistors are coupled to an output and to a drain region of the p-channel pre-charge transistor, and wherein a source region for the at least two input transistors is coupled to a ground through the n-channel enable transistor.

31. The electronic system of claim 29, wherein the dynamic pseudo-pMOS NAND gate includes at least two input transistors, wherein the at least two input transistors are p-channel transistors coupled in parallel, wherein a drain region for the at least two input transistors are coupled to a ground through an n-channel enable transistor, and wherein the at least two input transistors are coupled in parallel with the p-channel pre-charge transistor.

32. The electronic system of claim 31, wherein the drain region for the at least two input transistors are coupled to the logic output.

33. The electronic system of claim 29, wherein in operation the outputs are all pre-charged high.

34. The electronic system of claim 29, wherein each pseudo CMOS logic gate includes p-channel transistors, and in operation the p-channel transistors are used only for pre-charge.

35. A method of forming a logic circuit with delayed clocks, comprising:
forming a dynamic pseudo-nMOS logic gate; and
forming a dynamic pseudo-pMOS logic gate coupled thereto,
wherein each of forming the dynamic pseudo-nMOS logic gate and forming the dynamic pseudo-pMOS logic gate includes forming at least two logic inputs, forming a logic output, forming an enable clock input, forming a pre-charge clock input, forming an n-channel enable transistor having a gate connected to the enable clock input and forming a pull-up p-channel pre-charge transistor having a drain connected to the logic output and a gate connected to the pre-charge clock input,
wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

36. The method of claim 35, wherein forming the dynamic pseudo-nMOS logic gate includes forming a dynamic pseudo-nMOS NOR gate.

37. The method of claim 35, wherein forming the dynamic pseudo-pMOS logic gate includes forming a dynamic pseudo-pMOS NAND gate.

38. The method of claim 35, wherein forming the dynamic pseudo-nMOS logic gate includes forming at least two input transistors and forming the n-channel enable transistor for the dynamic pseudo-nMOS logic gate includes coupling a delayed enable clock transistor to a source region of the at least two input transistors.

39. The method of claim 38, wherein forming the at least two input transistors includes forming n-channel transistors coupled in parallel, wherein a drain region for the at least two input transistors are coupled to the logic output, and wherein the method further includes coupling a drain region for the at least two input transistors to a drain region of the p-channel pre-charge transistor.

40. The method of claim 35, wherein forming the dynamic pseudo-pMOS logic gate includes forming at least two input transistors and forming the n-channel enable transistor for the dynamic pseudo-pMOS logic gate includes coupling a delayed enable clock transistor to a drain of at least two input transistors.

41. The method of claim 40, wherein forming the at least two input transistors includes forming p-channel transistors coupled in parallel, wherein a drain region for the at least two input transistors are coupled to a ground through the n-channel enable transistor, and wherein the method further includes coupling the p-channel pre-charge transistor in parallel with the at least two input transistors.

42. A method of forming a logic circuit with delayed clocks, comprising:
   forming a dynamic pseudo-nMOS NOR gate; and
   forming a dynamic pseudo-pMOS NAND gate coupled thereto,
   wherein each of forming the dynamic pseudo-nMOS NOR gate and forming the dynamic pseudo-pMOS NAND gate includes forming at least two logic inputs, forming a logic output, forming an enable clock input, forming a pre-charge clock input, forming an n-channel enable transistor having a gate connected to the enable clock input and forming a pull-up p-channel pre-charge transistor having a drain connected to the logic output and a gate connected to the pre-charge clock input,
   wherein an enable clock signal on the enable clock input activates the n-channel enable transistor and allows logic values at the at least two logic inputs to result in a logic value at the logic output, and a pre-charge clock signal on the pre-charge clock input activates the p-channel pre-charge transistor and provides a high logic potential at the logic output in preparation for the enable clock signal, wherein the enable and pre-charge clock signals are separately controlled.

43. The method of claim 42, wherein the forming the dynamic pseudo-nMOS NOR gate includes:
   forming at least two input transistors, wherein the at least two input transistors are n-channel transistors coupled in parallel, wherein a drain region for the at least two input transistors are coupled to the logic output;
   coupling the n-channel enable clock transistor to a source region of the at least two input transistors; and
   coupling a drain region for the at least two input transistors to a drain region of the p-channel pre-charge transistor.

44. The method of claim 42, wherein forming the dynamic pseudo-pMOS NAND gate includes:
   forming at least two input transistors, wherein the at least two input transistors are p-channel transistors coupled in parallel;
   coupling a drain region for the at least two input transistors to a ground through the n-channel enable transistor; and
   coupling the p-channel pre-charge transistor in parallel with the at least two input transistors.

45. The method of claim 42, wherein the method further includes coupling the drain region for the at least two input transistors to the logic output.

46. A method for operating a logic circuit, comprising:
   providing an input signal to a series of pseudo-CMOS dynamic logic gates with delayed clocks, the series having an input and an output, wherein the series is repeating and each pseudo-CMOS dynamic logic gates includes:
      a dynamic pseudo-nMOS NOR gate having an input and an output; and
      a dynamic pseudo-pMOS NAND gate having an input and an output,
      wherein the dynamic pseudo-pMOS NAND gate is coupled to the dynamic pseudo-nMOS NOR gate;
   pre-charging all of the outputs high; and
   utilizing p-channel devices for pre-charge only.

47. A pseudo-CMOS dynamic logic circuit with delayed clocks, comprising:
   a dynamic pseudo-nMOS logic gate; and
   a dynamic pseudo-pMOS logic gate coupled thereto, wherein the dynamic pseudo-pMOS logic gate includes a delayed enable clock transistor coupled to a drain of at least two input transistors, wherein the input transistors are p-channel transistors coupled in parallel, wherein a drain region for the at least two input transistors are coupled to a ground through an n-channel enable transistor having a gate coupled to an enable clock, and wherein the at least two input transistors are coupled in parallel with a p-channel pre-charge transistor having a gate coupled to a pre-charge clock.

48. A pseudo-CMOS dynamic logic circuit with delayed clocks, comprising:
   a dynamic pseudo-nMOS NOR gate; and
   a dynamic pseudo-pMOS NAND gate coupled thereto,
   wherein the dynamic pseudo-nMOS NOR gate includes at least two input transistors, wherein the at least two input transistors are n-channel transistors coupled in parallel, wherein a drain region for the at least two input transistors are coupled to an output and to a drain region of a p-channel pre-charge transistor having a gate coupled to a pre-charge clock, and wherein a source region for the at least two input transistors is coupled to a ground through an n-channel enable transistor having a gate coupled to an enable clock.

49. A pseudo-CMOS dynamic logic circuit with delayed clocks, comprising:
   a dynamic pseudo-nMOS NOR gate; and
   a dynamic pseudo-pMOS NAND gate coupled thereto, wherein the dynamic pseudo-pMOS NAND gate includes at least two input transistors, wherein the at least two input transistors are p-channel transistors coupled in parallel, wherein a drain region for the at least two input transistors are coupled to a ground through an n-channel enable transistor having a gate coupled to an enable clock, and wherein the at least two input transistors are coupled in parallel with a p-channel pre-charge transistor having a gate coupled to a pre-charge clock.

50. The pseudo-CMOS dynamic logic circuit of claim 49, wherein the drain region for the at least two input transistors are coupled to an output.

51. A logic circuit, comprising:
a series of pseudo-CMOS dynamic logic gates with delayed clocks, the series having an input and an output, wherein the series is repeating and each pseudo-CMOS dynamic logic gates includes:
  a dynamic pseudo-nMOS NOR gate; and
  a dynamic pseudo-pMOS NAND gate coupled thereto, wherein the dynamic pseudo-nMOS NOR gate includes at least two input transistors, wherein the at least two input transistors are n-channel transistors coupled in parallel, wherein a drain region for the at least two input transistors are coupled to an output and to a drain region of a p-channel pre-charge transistor having a gate coupled to a pre-charge clock, and wherein a source region for the at least two input transistors is coupled to a ground through an n-channel enable transistor having a gate coupled to an enable clock.

52. A logic circuit, comprising:
a series of pseudo-CMOS dynamic logic gates with delayed clocks, the series having an input and an output, wherein the series is repeating and each pseudo-CMOS dynamic logic gates includes:
  a dynamic pseudo-nMOS NOR gate; and
  a dynamic pseudo-pMOS NAND gate coupled thereto, wherein the dynamic pseudo-pMOS NAND gate includes at least two input transistors, wherein the at least two input transistors are p-channel transistors coupled in parallel, wherein a drain region for the at least two input transistors are coupled to a ground through an n-channel enable transistor having a gate coupled to an enable clock, and wherein the at least two input transistors are coupled in parallel with a p-channel pre-charge transistor having a gate coupled to a pre-charge clock.

53. The logic circuit of claim 52, wherein the drain region for the at least two input transistors are coupled to an output.

54. An electronic system, comprising:
a logic circuit; and
a memory coupled thereto by a bus; and
wherein the logic circuit includes a pseudo-CMOS dynamic logic circuit with delayed clocks, comprising:
  a dynamic pseudo-nMOS logic gate; and
  a dynamic pseudo-pMOS logic gate coupled thereto, wherein the dynamic pseudo-pMOS logic gate includes a delayed enable clock transistor coupled to a drain of at least two input transistors, the at least two input transistors are p-channel transistors coupled in parallel, a drain region for the at least two input transistors are coupled to a ground through an n-channel enable transistor having a gate coupled to an enable clock, and the at least two input transistors are coupled in parallel with a p-channel pre-charge transistor having a gate coupled to a pre-charge clock.

55. An electronic system, comprising:
a processor, wherein the processor includes a series of pseudo-CMOS dynamic logic gates with delayed clocks, the series having an input and an output, wherein the series is repeating and each pseudo-CMOS dynamic logic gate includes:
  a dynamic pseudo-nMOS NOR gate; and
  a dynamic pseudo-pMOS NAND gate coupled thereto; and
a memory coupled to the processor via a bus,
wherein the dynamic pseudo-nMOS NOR gate includes at least two input transistors, wherein the at least two input transistors are n-channel transistors coupled in parallel, wherein a drain region for the at least two input transistors are coupled to an output and to a drain region of a p-channel pre-charge transistor having a gate coupled to a pre-charge clock, and wherein a source region for the at least two input transistors is coupled to a ground through an n-channel enable transistor having a gate coupled to an enable clock.

56. An electronic system, comprising:
a processor, wherein the processor includes a series of pseudo-CMOS dynamic logic gates with delayed clocks, the series having an input and an output, wherein the series is repeating and each pseudo-CMOS dynamic logic gate includes:
  a dynamic pseudo-nMOS NOR gate; and
  a dynamic pseudo-pMOS NAND gate coupled thereto; and
a memory coupled to the processor via a bus, wherein the dynamic pseudo-pMOS NAND gate includes at least two input transistors, wherein the at least two input transistors are p-channel transistors coupled in parallel, wherein a drain region for the at least two input transistors are coupled to a ground through an n-channel enable transistor having a gate coupled to an enable clock, and wherein the at least two input transistors are coupled in parallel with a p-channel pre-charge transistor having a gate coupled to a pre-charge clock.

57. The electronic system of claim 56, wherein the drain region for the at least two input transistors are coupled to an output.

58. A method of forming a logic circuit with delayed clocks, comprising:
forming a dynamic pseudo-nMOS logic gate; and
forming a dynamic pseudo-pMOS logic gate coupled thereto,
wherein forming the dynamic pseudo-pMOS logic gate includes forming at least two input transistors, forming the at least two input transistors includes forming p-channel transistors coupled in parallel, and forming an n-channel enable transistor having a gate coupled to an enable clock, wherein a drain region for the at least two input transistors are coupled to a ground through the n-channel enable transistor, and
wherein the method further includes forming a p-channel pre-charge transistor having a gate coupled to a pre-charge clock, and coupling the p-channel pre-charge transistor in parallel with the at least two input transistors.

59. A method of forming a logic circuit with delayed clocks, comprising:
forming a dynamic pseudo-nMOS NOR gate; and
forming a dynamic pseudo-pMOS NAND gate coupled thereto,
wherein forming the dynamic pseudo-pMOS NAND gate includes:
  forming at least two input transistors, wherein the input transistors are p-channel transistors coupled in parallel;
  forming an n-channel enable transistor having a gate coupled to an enable clock, wherein a drain region for the at least two input transistors are coupled to a ground through the n-channel enable transistor;
  forming a p-channel pre-charge transistor having a gate coupled to a pre-charge clock; and
  coupling the p-channel pre-charge transistor in parallel with the at least two input transistors.

* * * * *

UNITED STATES PATENT AND TRADEMARK OFFICE
CERTIFICATE OF CORRECTION

PATENT NO. : 6,972,599 B2
DATED : December 6, 2005
INVENTOR(S) : Forbes

It is certified that error appears in the above-identified patent and that said Letters Patent is hereby corrected as shown below:

Column 1,
Line 8, after "Logic," insert -- " --.
Line 51, after "gates" insert -- - --.
Line 51, delete "nMOS" and insert -- NMOS --.
Lines 52, 61 and 66, delete "pMOS" and insert -- PMOS --.

Column 2,
Line 11, delete "nMOS" and insert -- NMOS --.
Line 24, delete "2628" and insert -- 26-28 --.

Column 4,
Line 26, delete "nMOS" and insert -- NMOS --.
Line 46, delete "psuedo-pMOS" and insert -- pseudo-pMOS --.

Column 6,
Line 8, delete "NAIND" and insert -- NAND --.

Column 8,
Line 16, delete "sate" and insert -- gate --.
Line 43, delete "are" and insert -- is --.
Line 50, after "at least" insert -- two --.

Column 9,
Lines 14, 22, 28, 36, 47 and 50, delete "are" and insert -- is --.
Lines 44-45, after "wherein the" delete "at least two".
Line 63, delete "gates" and insert -- gate --.
Line 67, delete "sate" and insert -- gate --.

Column 10,
Lines 23, 32, 37, 46 and 60, delete "are" and insert -- is --.

Column 11,
Lines 39 and 48, delete "are" and insert -- is --.

Column 12,
Lines 17, 26 and 31, delete "are" and insert -- is --.
Line 27, after "through" delete "an" and insert -- the --.

UNITED STATES PATENT AND TRADEMARK OFFICE
CERTIFICATE OF CORRECTION

PATENT NO. : 6,972,599 B2
DATED : December 6, 2005
INVENTOR(S) : Forbes

It is certified that error appears in the above-identified patent and that said Letters Patent is hereby corrected as shown below:

Column 13,
Lines 3 and 15, delete "transistors" and insert -- transistors, --.
Lines 9, 22 and 54, delete "are" and insert -- is --.
Line 36, delete "input" and insert -- input, --.

Column 14,
Line 10, delete "gates" and insert -- gate --.
Lines 30, 45, 59 and 67, delete "are" and insert -- is --.

Column 15,
Lines 5 and 22, delete "gates" and insert -- gate --.
Lines 12, 29, 36 and 50, delete "are" and insert -- is --.

Column 16,
Lines 3, 22, 29, 42 and 60, delete "are" and insert -- is --.
Line 37, after "transistors," insert -- and --.
Line 39, delete "parallel," and insert -- parallel --.

Signed and Sealed this

Sixth Day of June, 2006

JON W. DUDAS
*Director of the United States Patent and Trademark Office*